United States Patent
Yamaguchi

(10) Patent No.: US 6,801,588 B1
(45) Date of Patent: Oct. 5, 2004

(54) COMBINED CHANNEL AND ENTROPY DECODING

(75) Inventor: Hirohisa Yamaguchi, Tsukuba (JP)

(73) Assignee: Texas Instruments Incorporated, Dallas, TX (US)

(*) Notice: Subject to any disclaimer, the term of this patent is extended or adjusted under 35 U.S.C. 154(b) by 830 days.

(21) Appl. No.: 09/668,796

(22) Filed: Sep. 22, 2000

Related U.S. Application Data

(60) Provisional application No. 60/164,063, filed on Nov. 8, 1999.

(51) Int. Cl.$^7$ .............................................. H04L 27/06
(52) U.S. Cl. ....................... 375/341; 375/233; 375/232
(58) Field of Search ................................. 375/341, 233, 375/232; 714/709, 755, 781

(56) References Cited

U.S. PATENT DOCUMENTS

| | | | | |
|---|---|---|---|---|
| 5,491,479 A | * | 2/1996 | Wilkinson | 341/58 |
| 6,046,874 A | * | 4/2000 | Takahashi | 360/65 |
| 6,161,209 A | * | 12/2000 | Moher | 714/780 |
| 6,678,263 B1 | * | 1/2004 | Hammons et al. | 370/342 |

OTHER PUBLICATIONS

A.J. Viterbi; An Intuitive Justification and a Simplified Implementation of a MAP Decoder for Convolutional Codes; IEEE Journal on Selected Areas in Communications; vol. 16, No. 2; Feb. 1998; p. 260–264.*

S. Benedetto et al.; A Soft–Input Soft–Output Maximum A Posteriori (MAP) Module to Decode Parallel and Serial Concatenated Codes; TDA Progress Report 42–127; Nov. 15$^{th}$, 1996; p. 1–20.*

S. Benedetto et al.; A Soft–Input Soft–Output APP Module for Iterative Decoding of Concatenated Codes; IEEE Communications Letters; vol. 1, No. 1; Jan. 1997; p. 22–24.*

M. Park et al.; Improved Joint Source–Channel Decoding for Variable–Length Encoded Data Using Soft Decisions and MMSE Estimation; IEEE Trnscations on Communications; 1999.*

J. Wen et al.; Soft–Input Soft–Output Decoding of Variable Length Codes; IEEE Transcations on Communications; vol. 50, No. 3; May 2002; p. 689–692.*

Jiangtao Wen, et al. "Utilizing Soft Information in Decoding of Variable Length Codes" Data Compression Conference, Proceedings DCC 99, IEEE Computer Society Press, Los Alamitos, California, pp. 131–139, Mar. 29, 1999.

James L. Massey "Variable–Length Codes and the Fano Metric" IEEE Transactions on Information Theory, vol. 18, No. 1, pp. 196–198, Jan. 1972.

N. Demir, et al. "Joint Source/Channel Coding for Variable Length Codes" Data Compression Conference, Proceedings DCC 98, IEEE Computer Society Press, Los Alamitos, California, pp. 139–148, Mar. 30, 1998.

(List continued on next page.)

Primary Examiner—Stephen Chin
Assistant Examiner—Sudhanshu C. Pathak
(74) Attorney, Agent, or Firm—W. James Brady, III; Frederick J. Telecky, Jr.

(57) ABSTRACT

A combined channel and entropy decoder is provided that achieves a significant bit-error rate improvement using likelihood values (61) instead of conventional bits. The likelihood values are stored in a buffer (62). A unique code-word is searched in the bit pattern or in the likelihood value. When a unique code-word is found at the identifier (63), candidate code-words are loaded into computation units where each unit computes code-word likelihood for a given code-word bit pattern. The code-word likelihood values are compared and the selected code information is fed back to the code-word controller 67 to proceed to the next-step decoding.

2 Claims, 3 Drawing Sheets

OTHER PUBLICATIONS

A. Kopansky, et al. "Sequential Decoding of MPEG–4 Coded Bitstreams for Error Resilience" Conference on Information Sciences and Systems, Baltimore, Maryland, Proceedings CISS 99, Mar. 17–19, 1999.

K.P. Subbalakshmi, et al. "Joint Source–Channel Decoding of Entropy Coded Markov Sources Over Binary Symmetric Channels" IEEE International Conference on Communications, Proceedings ICC 99, Vancouver, California, New York, IEEE Inc. New York, vol. 1, pp. 446–450, Jun. 6, 1999.

Vladimir B. Balakirsky "Joint Source–Channel Coding with Variable Length Codes" IEEE International Symposium on Information Theory, Ulm, Germany, Proceedings ISIT 97, IEEE Inc. New York, Jun. 29, 1997—Jul. 4, 1997.

Joachin Hagenauer, et al. "Iterative Decoding of Binary Block and Convolutional Codes" IEEE Transactions on Information Theory, IEEE Inc. New York, vol. 42, No. 2, pp. 429–445, Mar. 1996.

* cited by examiner $G_1=37/G_2=21$
RECURSIVE SYSTEMATIC CONVOLUTIONAL (RSC) ENCODER

COMBINED CHANNEL AND ENTROPY DECODING

This application claims priority under 35 USC §119(e)(1) of provisional application No. 60/164,063, filed Nov. 8, 1999.

FIELD OF INVENTION

This invention relates to digital communications and, more particularly, to channel and entropy coding.

BACKGROUND OF INVENTION

In digital communication, source information is quantized into bits and entropy-coded into code-words of variable length. This process is generally called redundancy reduction in speech, still image and video. See A. K. Jain, "Fundamentals of Digital Image Processing," published by Prentice Hall, 1989. The entropy-coded symbols are added with controlled amount of redundancy, which is generally called channel-coding. See R. E. Ziemer and W. H. Tranter, "Principles of Communication Systems, Modulation and Noise," published by Houghton Mifflin, 1995. The resultant sequence of binary data is converted into analog, modulated and transmitted on an RF carrier.

The received signal is demodulated into base-band signal, which is again converted into digital for channel decoding, through which, using the redundancy added at the transmission side, errors that occurred are corrected. The resultant sequence of binary data is then decoded into source codewords by mapping binary data segment into an element of a variable code.

In the standard implementation of a communication system, channel decoding and entropy decoding are treated as separate function blocks because their counterparts, entropy encoding and channel encoding, are treated separately.

SUMMARY OF INVENTION

In this application, it is taught that a new combined implementation of channel and entropy decoder significantly improves the transmission bit-error rate. The gained improvement is due to the use of maximum-likelihood information generated by the channel decoder and the intrinsic property of the variable-length codes that the code-lengths are variable.

DESCRIPTION OF PREFERRED EMBODIMENTS OF THE PRESENT INVENTION

Figure 1:
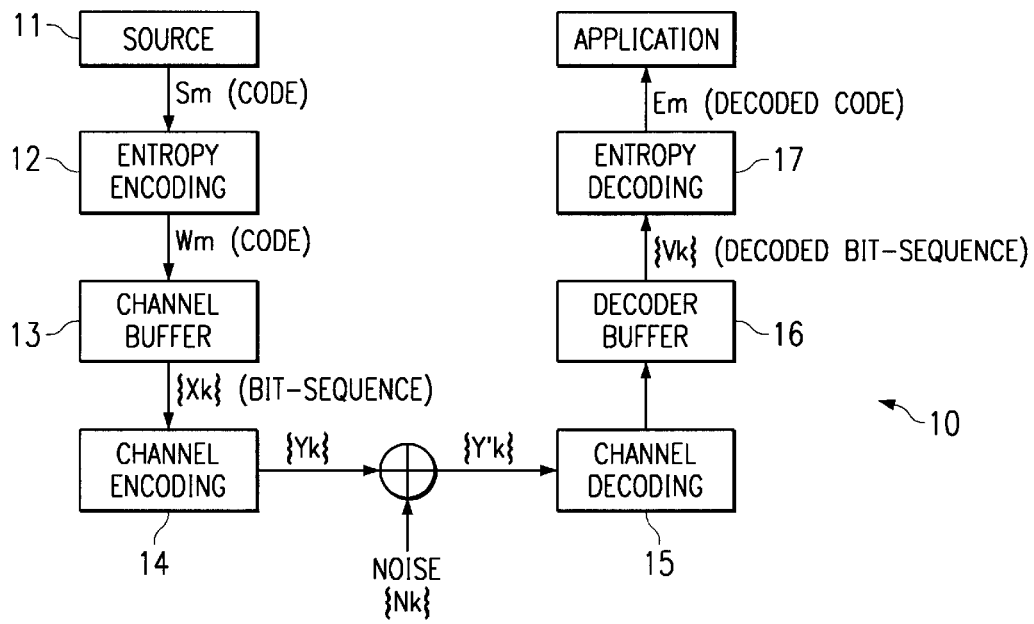
FIG. 1 illustrates a typical prior art communication system.

In order to explain the new invention, Applicants refer to the typical communication system of FIG. 1 and discuss convolution coding and Turbo encoder and a Soft-Output Viterbi or MAP decoder.

FIG. 1 illustrates a typical communication system 10. First the source 11 is regarded as generating a symbol Sm out of a given set of source alphabet symbols. The source output symbol is then one-to-one mapped to a variable length code Wm. The entropy-coded symbols are buffered at buffer 13 and added with a controlled amount of redundancy at channel encoding 14 to get output Yk. In a typical system, the received input Y'k is channel decoded 15 and the buffered output at buffer 16 is entropy decoded at decoder 17. In actual entropy coding, a number of variable-length code sets are needed and used to represent the source information in the smallest number of bits. Because the new implementation discussed here will be easily extended to general cases as explained later, we will regard entropy coder 12 as consisting only one set of variable-length codes. Then corresponding to Sm, one variable length code Wm is chosen from the set of channel codes Z (Wm∈Z).

Table 1 shows an example of variable-length codes. Values in the table represent the set of source symbols and the codes correspond to the set Z above. Output code bits from the entropy coder 12 are concatenated sequentially. When this binary sequence (Y'k) arrives at the receiver without error, the original input source symbols can be decoded by tracing sequential 0 and 1 bits because codes are defined to allow this decoding unique.

TABLE 1

| value (code #) | binary code |
| --- | --- |
| 1 | 00 |
| 2 | 010 |
| 3 | 1110 |
| 4 | 11110 |
| 5 | 111110 |
| 6 | 1111110 |
| 7 | 11111110 |
| 8 | 111111110 |

This particular set of codes in Table 1 is used to encode the differential DC signal in the JPEG standard. 0 is replaced by −1 in the coding and decoding.

In a system with convolution coding and, in particular, a Turbo encoder 14, the output of the Turbo decoder 15 is a binary sequence. The output bit sequence of the channel decoder 15 can have bit errors. The effect of these bit errors on the entropy decoder 17 is very serious because variable-length coding assumes that previous bit-sequence has been correctly decoded. When a bit error occurs, either a wrong code-word is selected or no corresponding code-word is found in the code-word set. In conventional variable-length code decoding, the decoding process is terminated at such point and some other means is sued to prevent catastrophic signal degradation. It is empirically known that once a bit-error occurs during the variable-length code decoding, no effective means exists to recover the decoding process unless a number of special and unique codes are inserted in the bit sequence.

Figure 2A:
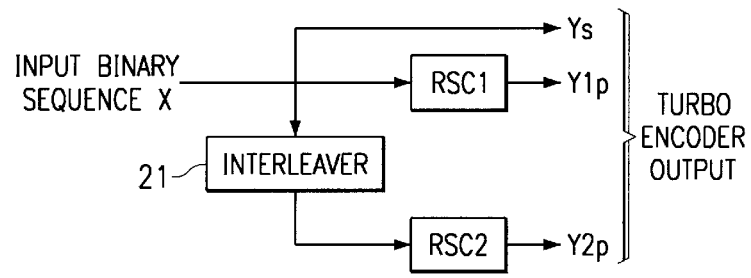
FIG. 2 illustrates a Turbo encoder according to the prior art.
Figure 2B:
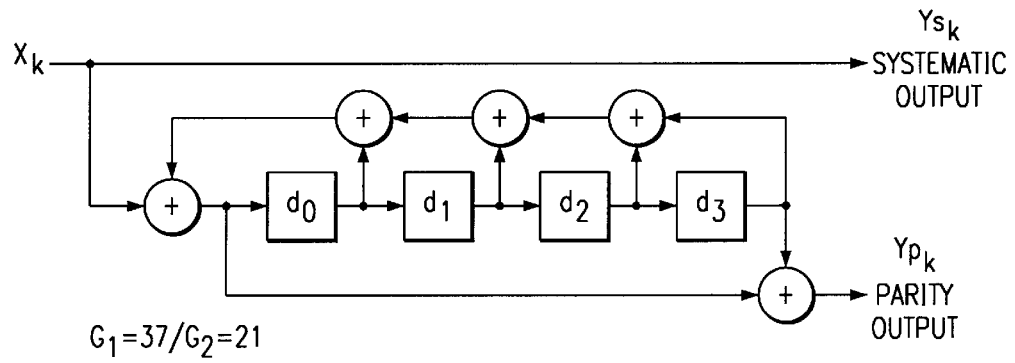

For the channel coding 14, we pick the convolutional coding which is commonly used for the wired and wireless communication. For convolution encoding, see R. L. Peterson, R. E. Ziemer, and D. E. Borth, entitled "Introduction to Spread Spectrum Communications," Prentice Hall, 1995. In the convolutional coding, one input bit information is repeated a number of times using elaborate feedback or feed-forward loop. The ratio of the input number of bits with respect to the output bits is called the rate of the convolutional code. In the following, we select Turbo coding for channel encoding 14 that uses feedback (recursive systematic coding) with rate 1/3. Referring to FIG. 2(a), from the input binary sequence x, three output sequences Ys, Y1p and Y2p are generated using Recursive Systematic Convolution (RSC) encoders RSC1 and RSC2. The convolution encoder used for Turbo coding has rate=2/3, constraint length=5. The Ys is the systematic output and Y1p and Y2p are parity outputs. An example of the structure of Recursive Systematic Convolution Encoders RSC1 and RSC2 is shown in FIG. 2(b). The interleaver 21 is used to uncorrelate the binary input sequence for RSC1 and RSC2. Output Y is exactly the same copy of the input binary sequence. The convolution encoder 14 introduces an infinite-length correlation in parity outputs. For Turbo encoding, see C. Berrou and A. Glavieux, "Near Optimum Error Correcting Codes and Decoding Turbo Codes," *IEEE Transactions on Communications*, Vol. 44, no. 10, October 1996. The same argument is also valid for the standard convolutional encoding that employs Viterbi decoding. The net channel encoding rate can be further improved by alternatively dropping the parity bit, Y1p and Y2p, while Ys is sent without dropping. In this case, the encoding rate becomes 1/2 instead of 1/3. This process is generally called puncturing. We will henceforth assume that such puncturing is performed at transmitter but this is not an essential assumption.

Figure 3:
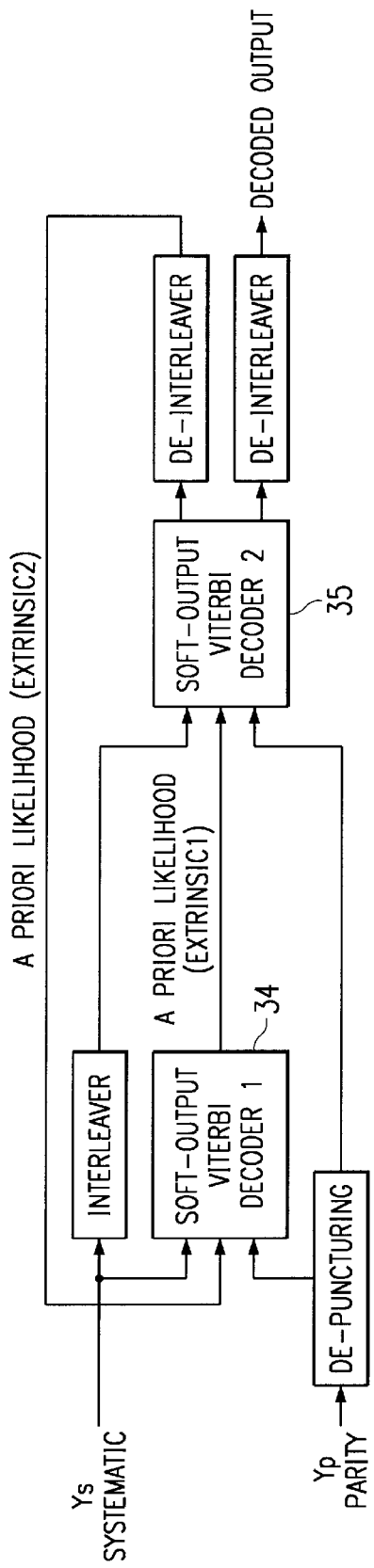
FIG. 3 illustrates the structure of the Turbo encoder of FIG. 2.

FIG. 3 shows the structure of Turbo decoder 15 corresponding to the encoder shown in FIG. 2. We will denote the receiver Y'k in FIG. 1 simply as Yk in the following for simplicity. Due to the puncturing at the transmitter, 0 bit is inserted alternately to complement the missing bits in Y1p and Y2p sequences (de-puncturing 31). There are two basic decoders 34 and 35 each one of which is called Soft-Output Viterbi Decoder (SOVA) 33 or Maximum A Posteriori Likelihood Decoder (MAP). See also J. Hagenauer, E. Offer and L. Papke, "Iterative Decoding of Binary Block and Convolution Codes," *IEEE Trans. on Information Theory*, Vol. 42, no. 2, March 1996. Viterbi decoder is widely known as the maximum a posteriori probability estimator for the original input binary sequence. It uses the available Ys and Y1p, or Ys and Y2p (with interleaving) and is known to provide optimum channel decoder performance.

Using the probability theory, it can be shown that the best channel decoder maximizes the following a posteriori probability of input Xk using the received Yk (see FIG. 1).

$$P(X_k|Y_k) = \frac{P(X_k, Y_k)}{P(Y_k)} = \frac{P(Y_k|X_k)P(X_k)}{P(Y_k)} \quad \text{EQ.(2)}$$

In EQ.(2), Bayes rule was used to represent the a posteriori probability P(Xk|Yk) by the a priori probability P(Yk|Xk) and the prior probabilities P(Xk) and P(Yk). See W. B. Davenport and W. J. Root, "An Introduction to the Theory of Random Signals and Noise," McGraw Hill, 1958. In order to estimate Xk by Yk with respect to the possible value of −1 and +1, comparison of P(Xk=−1|Yk) and P(Xk=+1|Yk) is made in logarithm as follows:

$$L(x|y) = \log\frac{P(x=+1|y)}{P(x=-1|y)} = \log\frac{P(y|x=+1)}{P(y|x=-1)} + \log\frac{P(x=+1)}{P(x=-1))} \quad \text{EQ.(3)}$$

This ratio is called the log likelihood ratio or simply the likelihood ratio. When the noise Nk in FIG. 1 is Gaussian white noise, P(y|x=+1) is shown to be $$P(y|x=+1) = \frac{1}{\sqrt{2\pi\sigma^2}}e^{-\frac{(y-a)^2}{2\sigma^2}} \quad \text{EQ.(4)}$$

where $\sigma^2$ is $$\sigma = \left(\frac{E_s}{N_0}\right)^{-1} \quad \text{EQ.(5)}$$

and Es, symbol power, is given by Eb/R. Eb represents the signal power per one bit of information and R is the coding rate. Also, a in EQ.(4) stands for the channel fading phenomenon, but this is not essential in present discussion. Hence, a=1 is assumed in the following. In terms of these probabilities, the Viterbi or MAP decoder in FIG. 3 computes the a priori likelihood of p(Xk) from the available likelihood information as shown in FIG. 4.

Figure 4:
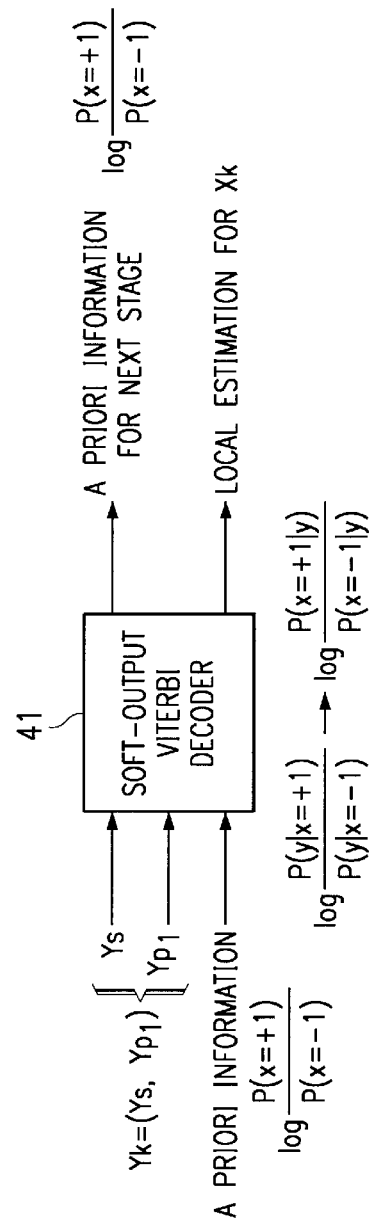
FIG. 4 illustrates the structure of the Soft-Output-Viterbi or MAP decoder used for the Turbo decoder.

Referring to FIG. 4, decoder 41 (34 or 35) generates a priori information p(Xk) from Ys and Yp1 (or Yp2). If there exists a priori information p(Xk) available together with Ys, it is also taken into account as shown above. Decoder 41 can also generate the local estimate for Xk.

FIG. 3 shows that a priori information of the first stage decoder 34 is subsequently used as an input to the second Viterbi or MAP decoder 35 and at the same time, the a priori information of the second decoder 35 is fed-back to the first decoder 34. Thus, when the a priori information passed to the next decoders is carefully defined in the way that such process improves the estimation accuracy of the original Xk, it is shown that the estimated Xk converges to the original Xk as the feed-back is repeated.

In conventional communication system, output of the Turbo decoder is a binary sequence. This sequence is generated by applying the hard-decision to the a posteriori likelihood value of the Turbo decoder.

$$\log\frac{P(x=+1|y)}{P(x=-1|y)} > 0 \rightarrow x = +1 \quad \text{EQ.(6)}$$

$$\log\frac{P(x=+1|y)}{P(x=-1|y)} \leq 0 \rightarrow x = -1$$

The output bit sequence of the channel decoder contains bit-errors. In general, the bit-error rate (BER) of 10E-3 to 10E-4 is required for the real-time speech and video communication. Quality of the channel is maintained by controlling the transmission signal power.

The effect of these bit errors on the entropy decoder (17 in FIG. 1), however, is very serious because variable-length coding assumes that previous bit-sequence has been correctly decoded. When a bit error occurs, either a wrong code-word is selected or no corresponding code-word is found in the code-word set. In conventional variable-length code decoding, the decoding process is terminated at such point and some other means is used to prevent catastrophic signal degradation. It is empirically known that once a bit-error occurs during the variable-length code decoding, no effective means exists to recover the decoding process unless a number of special and unique codes are inserted in the bit-sequence. According to the present invention, it is shown that by combining the channel decoder (Turbo or Viterbi decoder) 15 with the entropy (variable-length) decoder 17, a significant improvement is achieved in the bit-error rate.

In the communication receiver, input signal to the Viterbi decoder 15 can be quantized into bits (hard-decision) or into multi-levels (soft-decision). It has been widely known that soft-decision Viterbi decoder achieves a significant improvement compared with the hard-decision decoder. This is because likelihood of the input signal is preserved in the multi-level information and it is lost in the hard-decision decoder. Similar observation can be applied to the channel and the entropy decoder. Conventional entropy decoder 17 receives hard-decision bits from the channel decoder 15. However, when the likelihood information is passed to the entropy decoder 17, a significant improvement is also possible. From FIGS. 3 and 4, it is seen that such likelihood information can be provided in form of the a priori information from the Viterbi or MAP decoder 15 (34 and 35 of FIG. 3).

There are two approaches to take advantage of such information in the decoding. One is very simple and the other is significantly more powerful but more complex to implement.

(1) Simple realization of the combined channel 15 and entropy decoder 17

We assume that the decoding starts from a correct bit position. We use, instead of the bit data, the likelihood values from the channel decoder and compute the code-word likelihood for all the code-words in the set. Code-word likelihood can be defined by $$P^{(m)} = \sum_{k=0}^{N_m-1} c_k l_k \qquad \text{EQ.(7)}$$

where $N_m$ is the length of the code, m denotes the m-th code-word in the set, $c_k$ (k=0, ..., $N_m$) represents the code-word bit-sequence (0 and 1 need be mapped to −1 and 1) and $l_k$ the likelihood values obtained form the channel decoder. For Table 1, eight code-word likelihood values are obtained.

There are many variations of algorithms for choosing the best code-word. One approach introduced here is to find the local maxima in the likelihood value (code-word #3 and #7 are thus found in FIG. 5) as the decoded code-word. This algorithm has been found better than choosing the simple maximum. This comes from the characteristic of the code-word likelihood that it monotonically increases as far as bits are correctly decoded but it turns into a random walk when it is not matched any more. Further details are discussed in Appendix A.

For example, consider the actual case in which the conventional decoding has failed:

From the channel decoder, the bit-sequence [111001111 - - - ] has been obtained. Using Table 1, the code-word #3 [1110] is chosen, but the correct coded-word was #4. Now we get the likelihood values from the channel decoder:

[4.9, 4.3, 3.8, −0.3, −5.0, 4.5, 4.1, 5.4, 2.4, - - - ]

which corresponds to [111001111 - - - ]. Now the code-word likelihood values are computed;

[−9.2, −4.4, 13.2, 17.7, 3.1, 8.1, 10.9, 19.2]

Figure 5:
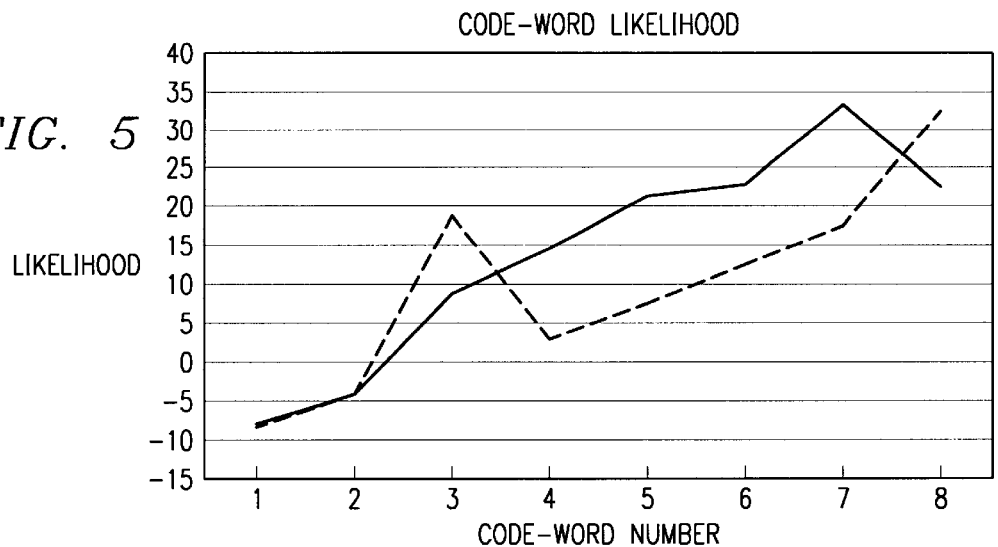
FIG. 5 is a plot of examples of code-word likelihood values versus code word number.

Here we can observe that there exists a local maxima at code-word #4 and another large value at code-word #8. In general, code-word likelihood monotonically increases for longer code length. This needs to be taken into account by biasing the local maxima search according to the code-length. By this algorithm, the correct code-word #4 corresponding to the local maxima can be chosen. FIG. 5 shows two other examples of code-word likelihood versus code-word number obtained using the variable-length codes of Table 1.

Computer simulation has been made to study the performance of the new decoding method. Communication channel has been defined as shown in FIG. 1. Variable-length codes of Table 1 were used, from which code-word was selected at random and the corresponding bit-sequence was then convolutional-coded using Turbo encoder (rate 1/2 and constraint length 5), added with white noise and then Turbo decoded. Turbo decoder has been controlled (by feed-back repetition number) so that the output decoded BER becomes 10E-3. Likelihood values were then used for the variable-length decoder and the new decoding has been compared with the conventional bit-wise hard-decision variable-length decoding. As the result, by using the simple rule explained in FIG. 5, it has been observed that bit errors can be reduced to 1/3 to 1/5 in number. By studying elaborate algorithms, it appears that 1/10 reduction would be achievable.

Figure 6:
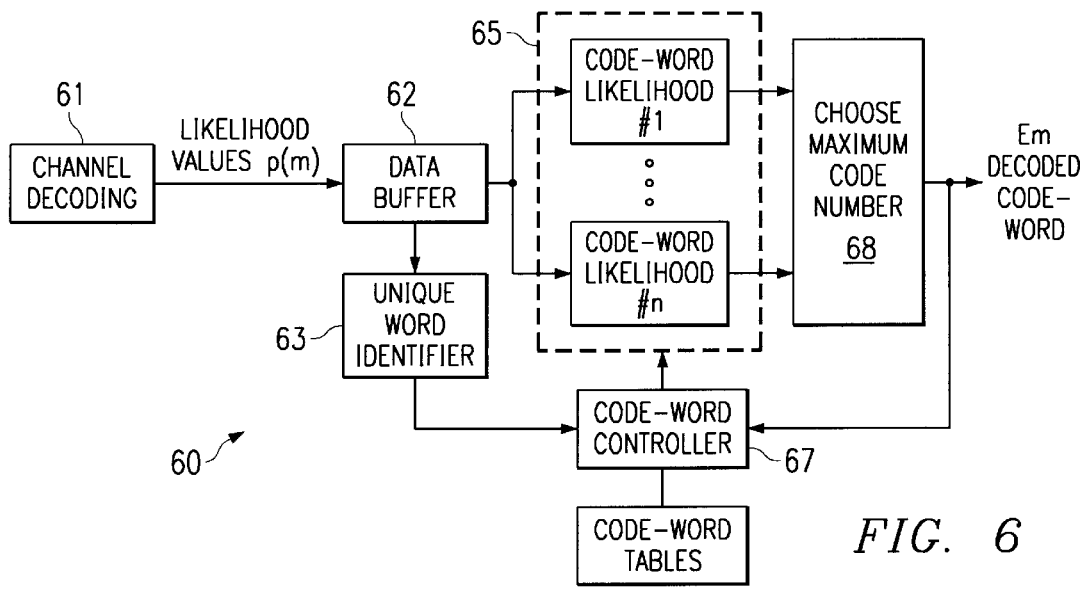
FIG. 6 illustrates a diagram of the new channel-entropy decoder according to one embodiment of the present invention.

FIG. 6 also shows other related functions needed in the practical system. Output from the channel decoder (likelihood values) 61 are stored in buffer 62. Before the variable-length decoding starts, a unique code word (start code) is searched in either the bit pattern or in the likelihood value at the unique word identifier 63. When the unique word is found, candidate code-words are loaded into separate code-word likelihood computation units #1 through n inside the dotted block 65. Each unit #1 through n computes EQ.(7) for the given code-word bit-pattern. In actual implementation, a number of variable-length and fixed length code sets are used according to the coding syntax. Hence, in order to find all the code-word candidates, a number of different code sets are referenced and loaded as the candidate codes. A search algorithm that has been tested follows:

(a) Compute the code-word likelihood for all the code length (starting with m=2 and ending with m=9). If there is a drop in the code-word likelihood value, count it as a candidate word. For example, the code-word likelihood for m=2 was 1.3, m=3 was 2.5 and m=4 was 2.2, so on, then m=3 code-word is taken as a candidate. When multiple codes correspond to the same word-length, compute the likelihood and judge if there is one that causes such phenomenon. If there is no such phenomenon and the likelihood value increases monotonically, decode word is the first 2-bit code.

(b) Choose the code that causes the (relative to the code length) largest drop in the likelihood value.

When the code-word has been chosen 68 by comparing the code-word likelihood values, the selected maximum value code information is fed-back to the code-word controller 67 to proceed to the next-step decoding. The decoded code-word $E_m$ is provided out of the decoder. When the decoding collapses, the unique word search process needs to be started again.

(2) Improved performance implementation by one-word look-ahead.

This approach is only applicable to the variable length codes. When a decoding error occurs, the next code-word can become an error. Hence, by computing the next code-word likelihood and verifying the existence of legitimate code word, some improvement is possible. Extension of this idea leads to the following implementation.

(3) More powerful but more complex implementation.

Figure 7:
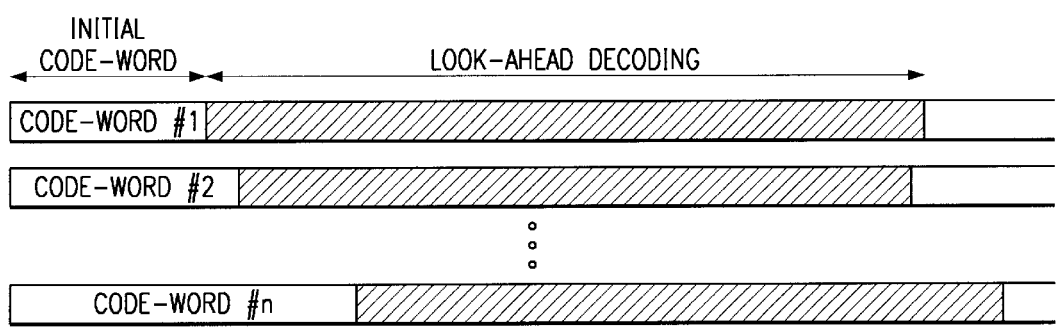
FIG. 7 illustrates likelihood computation by look-ahead decoding.

Decoding by considering the future code-word likelihood is explained by FIG. 7.

The initial code words are the same ones considered in FIG. 6. The likelihood decoding is continued (in the best-effort method as discussed in (1)). The extended decoding is continued until the total decoded bit-length exceeds a given threshold. Because of the variable code-lengths, extended code-lengths also vary, but as we extend the decoding length long enough, the total code-lengths become nearly of an equal length. Code-word likelihood values are compared between these extended code-words and the probability that the correct code-word sequence is decoded rapidly increases as the extended code-length is increased. The complexity of the decoder increases likewise and a compromise needs to be made. Structure of the decoder is the same as FIG. 6 and, thus, is omitted.

Using likelihood values instead of bits, a new combined channel (Turbo or Viterbi decoder) and entropy decoder implementation has been discussed. It has been shown that a significant improvement is achieved in BER by the new method. System structure implementing the new decoder has been discussed for two approaches; simple implementation and more powerful, but more complex, implementation. This new decoding is applicable not only to the variable-length codes, but also to the fixed-length codes. In the latter case, performance of the proposed method improves as the code distance (Hamming distance) increases. As for the fixed length codes that exhaustively span all bit combination such as three bit code of 000,001, 010, . . . , 111, the new approach can likewise be applied.

What is claimed is:

1. In a digital communication system wherein source information is quantized into bits and entropy-coded into code words of variable length and the entropy-coded words are channel coded, a decoder comprising:

a combined channel and entropy variable length decoder using maximum likelihood information generated by the channel decoder portion of the combined channel and entropy decoder; said decoder includes a buffer for storing likelihood values, means for determining a unique code word by searching for it in a bit pattern or likelihood value and loading candidate code words, means for computing code-word likelihood for a given code-word bit pattern, and means for comparing said code-word likelihood values and providing a selected code; said means for computing code-word likelihood candidates computed according to $$P^m = \sum_{k=0}^{N_m-1} c_k l_k,$$

where $N_m$ is the length of the code, m denotes the $m^{th}$ code word in the set, $c_k$(k=0, . . . , $N_m$) represents the code-word bit sequence and $l_k$ the likelihood values obtained from the channel decoder.

2. The system of claim 1, wherein the channel decoder is a Viterbi or MAP decoder.

* * * * *